United States Patent
Fujinawa et al.

(10) Patent No.: US 7,141,645 B2
(45) Date of Patent: *Nov. 28, 2006

(54) WIRING-CONNECTING MATERIAL AND WIRING-CONNECTED BOARD PRODUCTION PROCESS USING THE SAME

(75) Inventors: Tohru Fujinawa, Ibaraki (JP); Masami Yusa, Ibaraki (JP); Satoyuki Nomura, Ibaraki (JP); Hiroshi Ono, Ibaraki (JP); Itsuo Watanabe, Ibaraki (JP); Motohiro Arifuku, Ibaraki (JP); Hoko Kanazawa, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/846,507

(22) Filed: May 17, 2004

(65) Prior Publication Data

US 2004/0214979 A1   Oct. 28, 2004

Related U.S. Application Data

(63) Continuation of application No. 10/069,053, filed on Jul. 8, 2002, now Pat. No. 6,762,249.

(30) Foreign Application Priority Data

Aug. 25, 1999 (JP) ................................. 11-238409
Mar. 28, 2000 (JP) ............................... 2000-92978

(51) Int. Cl.
  C08F 283/04   (2006.01)
(52) U.S. Cl. .................. 528/455; 525/127; 525/426; 525/457; 522/90; 522/111; 524/780
(58) Field of Classification Search ................ 525/455, 525/127, 426; 522/90, 111; 524/780
See application file for complete search history.

(56) References Cited

U.S. PATENT DOCUMENTS

| 3,994,764 | A | | 11/1976 | Wolinksi |
| 4,223,115 | A | * | 9/1980 | Zalucha et al. ............. 525/455 |
| 4,494,610 | A | * | 1/1985 | Walker ........................ 166/301 |
| 4,517,279 | A | * | 5/1985 | Worns ...................... 430/286.1 |
| 5,395,876 | A | * | 3/1995 | Frentzel et al. ............. 524/440 |
| 5,464,494 | A | | 11/1995 | Bolte et al. |
| 5,592,737 | A | | 1/1997 | Middelman et al. |
| 5,866,044 | A | | 2/1999 | Saraf et al. |
| 6,039,896 | A | | 3/2000 | Miyamoto et al. |

FOREIGN PATENT DOCUMENTS

| CN | 1180669 C | 12/2004 |
| JP | 01-297482 | 11/1989 |
| JP | 9-169958 | 6/1997 |
| JP | 09-169958 | 6/1997 |
| JP | 10-130600 | 5/1998 |
| JP | 11-097825 | 4/1999 |
| JP | 11-185526 | 7/1999 |
| JP | 11-335641 | 12/1999 |

OTHER PUBLICATIONS

Supplementary European Search Report, transmitted Sep. 27, 2002, for EP 00 95 5037.
Chinese Office Action dated Nov. 21, 2003, for Application No. 00813017.5.
Official Action (Notice of Rejection), for Application No. 10-2005-0039023, dated Sep. 12, 2005.
Official Chinese Action, dated Dec. 20, 2005, for Chinese Application No. 2004100955023.

* cited by examiner

Primary Examiner—Rachel Gorr
(74) Attorney, Agent, or Firm—Antonelli, Terry, Stout and Kraus, LLP.

(57) ABSTRACT

The present invention provides a wiring-connecting material comprising from 2 to 75 parts by weight of a polyurethane resin, from 30 to 60 parts by weight of a radical-polymerizable substance and from 0.1 to 30 parts by weight of a curing agent capable of generating a free radical upon heating, and a process for producing a wiring-connected board by using the wiring-connecting material. The wiring-connecting material of the present invention may preferably further contain a film-forming material and/or conductive particles.

6 Claims, 2 Drawing Sheets

WIRING-CONNECTING MATERIAL AND WIRING-CONNECTED BOARD PRODUCTION PROCESS USING THE SAME

This application is a Continuation application of prior application Ser. No. 10/069,053, filed Jul. 8, 2002 now U.S. Pat. No. 6,762,249, which is a National Stage application filed under 35 USC §371 of International (PCT) Application No. PCT/JP00/05763, filed Aug. 25, 2000. The contents of application Ser. No. 10/069,053 are incorporated herein by reference in their entirety.

TECHNICAL FIELD

This invention relates to a wiring-connecting material making use of an adhesive composition and conductive particles, and a process for producing a wiring-connected board.

BACKGROUND ART

Epoxy resin adhesives are widely used for various purposes such as electric, electronic, construction, automobile and airplane materials because they can provide a high bond strength and have excellent resistance to water and resistance to heat. In particular, one-pack type epoxy resin adhesives are usable with ease because it is unnecessary to blend the chief material and the curing agent, and are widely used in the form of film, paste or powder. In such one-pack type epoxy resin adhesive, epoxy resins, curing agents and modifiers can be combined in variety. Hence, appropriate selection of their combination enables achievement of any desired performance as disclosed in, e.g., Japanese Patent Application Laid-open (KOKAI) No. Sho62-141083.

A filmlike adhesive disclosed in this Japanese Patent Application Laid-open (KOKAI) No. Sho62-141083, however, can not sufficiently be reactive at the time of curing because it uses a catalytic curing agent which is inert at normal temperature, in order to achieve both short-time curing properties (fast-curing performance) and storage stability (storage properties) to attain a good stability. Thus, though having a good operability, it must be heated at about 140° C. to about 180° C. for a connecting time of about 20 seconds, or must be heated at about 180° C. to about 210° C. for a connecting time of 10 seconds.

In recent years, however, in the field of precision electronic instruments, circuits are being made highly dense, so that connecting terminals have come to be formed in and at very narrow width and pitch. Hence, this has caused come-off or peeling and misregistration of wiring in some cases when terminals are interconnected under connecting conditions adapted to such conventional epoxy resin wiring-connecting materials. Also, it has been sought to shorten connecting time so as to enable connection within 10 seconds in order to improve production efficiency. To satisfy these demands, it is sought to provide a low-temperature fast-curable wiring-connecting material capable of curing at a low temperature and yet in a short time.

DISCLOSURE OF THE INVENTION

An object of the present invention is to provide a wiring-connecting material for electric and electronic use, having better low-temperature fast-curing performance than any conventional epoxy resin connecting materials and also having a pot life, and a process for producing a wiring-connected board making use of such a connecting material.

The present invention provides a wiring-connecting material comprising from 2 to 75 parts by weight of a polyurethane resin, from 30 to 60 parts by weight of a radical-polymerizable substance and from 0.1 to 30 parts by weight of a curing agent generating a free radical upon heating. The wiring-connecting material of the present invention is especially preferable as a connecting material which is interposed between connecting terminals facing each other and with which the connecting terminals are electrically interconnected in the pressure direction while pressing the connecting terminals facing each other.

The wiring-connecting material of the present invention may also preferably further comprise a film-forcing material and/or conductive particles. The film-forming material may preferably be mixed in an amount of from 0 to 40 parts by weight, and a polyimide resin is preferred.

As the polyurethane resin, a resin having a flow point of from 40° C. to 140° C. as measured by the flow tester method may preferably be used. As the curing agent, it is preferable to use a curing agent having a weight retention at 25° C. for 24 hours (i.e., the proportion of a difference in mass before and after open-leaving at room temperature (25° C.) and normal pressure for 24 hours, with respect to the mass before leaving) of not less than 20% by weight. As the radical-polymerizable substance, urethane acrylate is preferred.

The present invention also provides a wiring-connected board production process comprising the step of interconnecting terminals of wiring by the use of the wiring-connecting material of the present invention. More specifically, the present invention provides a process for producing a wiring-connected board, comprising a connecting step of interconnecting wiring members each having a connecting terminal, which members are so interconnected that their connecting terminals are able to make conduction between them;

the connecting step comprising the step of heating the wiring-connecting material of the present invention while applying a pressure thereto via the wiring members; the wiring-connecting material being held between at least two wiring members so disposed that their sides having the connecting terminals face to each other. This production process of the present invention is especially preferable when at least one surface of the connecting terminal is formed of at least one metal selected from gold, silver and a platinum group metal.

BEST MODES FOR CARRYING O THE INVENTION

A. Curing Agent

Figure 1:
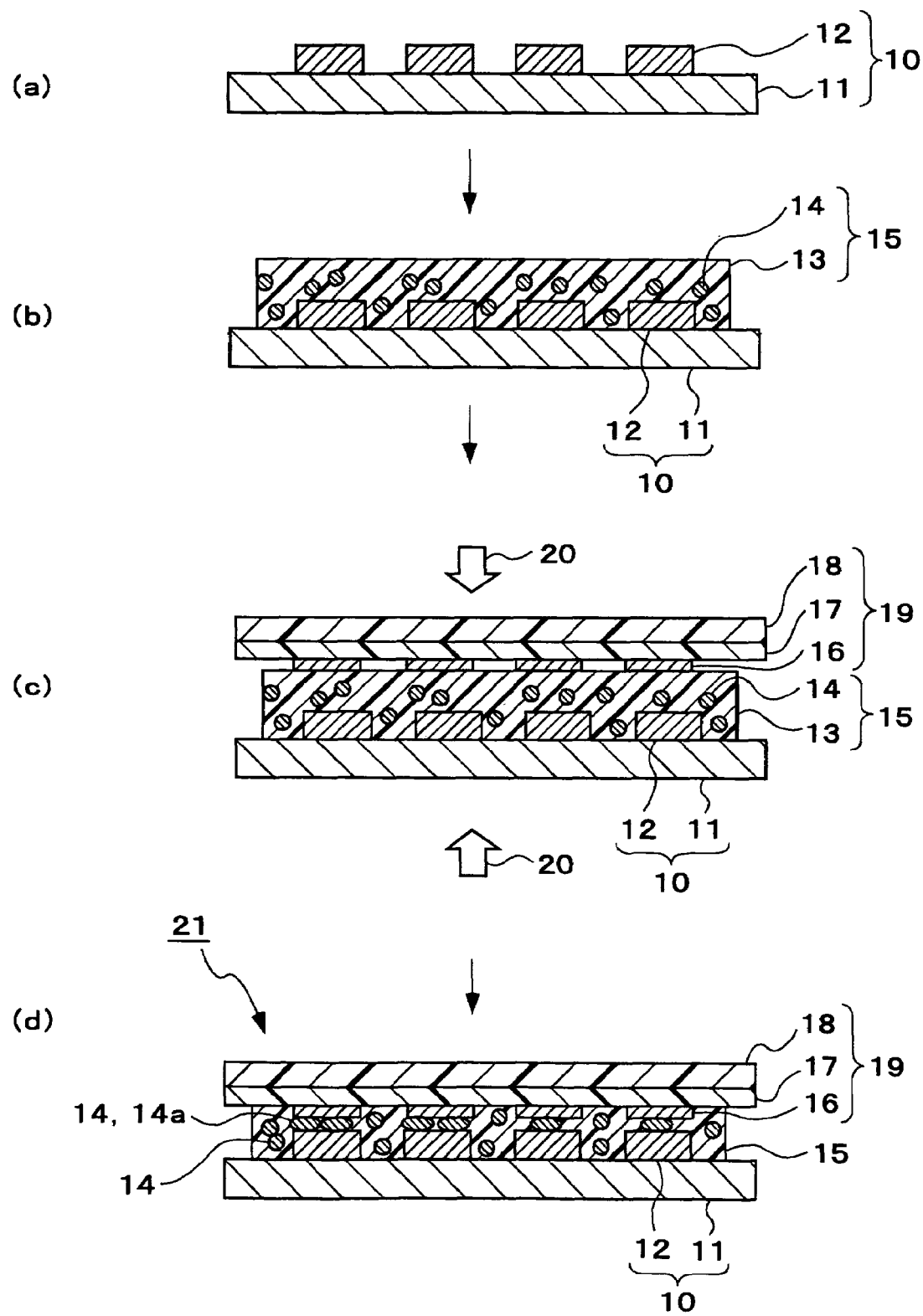
FIGS. 1(a) to 1(d) illustrate a wiring-connected board production process carried out in Example 1.

The curing agent used in the present invention is a curing agent capable of generating a free radical upon decomposition by heating, such as a peroxide compound or an azo compound. The curing agent may appropriately be selected in accordance with the intended connecting temperature, connecting time, pot life and so forth. In order to achieve a high reactivity and a long pot life, preferred is an organic peroxide showing a 10-hour half-life at a temperature of 40° C. or above and a 1-minute half-life at a temperature of 180° C. or below, and more preferred is an organic peroxide showing a 10-hour half-life at a temperature of 60° C. or above and a 1-minute half-life at a temperature of 170° C. or below.

When the connecting time is made not longer than 10 seconds, the curing agent may preferably be mixed in an amount of from 0.1 to 30 parts by weight, and more preferably from 1 to 20 parts by weight, in order to attain a sufficient rate of reaction. If the curing agent is mixed in an amount less than 0.1 part by weight, any sufficient rate of reaction can not be attained to tend to make it difficult to attain a good bond strength and a small connection resistance. If it is mixed in an amount more than 30 parts by weight, the wiring-connecting material tends to have low flow properties, cause a high connection resistance and have a short pot life.

The organic peroxide preferred as the curing agent used in the present invention is exemplified by diacyl peroxides, peroxydicarbonates, peroxyesters, peroxyketals, dialkyl peroxides, hydroperoxides and silyl peroxides.

The diacyl peroxides may include isobutyl peroxide, 2,4-dichlorobenzoyl peroxide, 3,5,5-trimethylhexanoyl peroxide, octanoylperoxide, lauroylperoxide, stearoylperoxide, succinic peroxide, benzoyl peroxytoluene and benzoyl peroxide.

The peroxydicarbonates may include di-n-propyl peroxydicarbonate, diisopropyl peroxydicarbonate, bis(4-t-butylcyclohexyl)peroxydicarbonate, di-2-ethoxyethyl peroxydicarbonate, di(2-ethylhexyl peroxy)dicarbonate, dimethoxybutyl peroxydicarbonate, and di(3-methyl-3-methoxybutyl peroxy)dicarbonate.

The peroxyesters may include cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxypivarate, 1,1,3,3-tetramethylbutyl peroxy-2-ethylhexanonate, 2,5-dimethyl-2,5-di(2-ethylhexanoyl peroxy)hexane, 1-cyclohexyl-1-methylethyl peroxy-2-ethylhexanonate, t-hexyl peroxy-2-ethylhexanonate, t-butyl peroxy-2-ethylhexanonate, t-butylperoxyisobutyrate, 1,1-bis (t-butylperoxy) cyclohexane, t-hexyl peroxyisopropylmonocarbonate, t-butyl peroxy-3,5,5-trimethylhexanonate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, and t-butyl peroxyacetate.

The peroxyketals may include 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, and 2,2-bis(t-butylperoxy)decane.

The dialkyl peroxides may include $\alpha,\alpha'$-bis (t-butylperoxy) diisopropylbenzene, dicumyl peroxide, 2,5-dimethyl-2,5-di(t-butylperoxy)hexane, and t-butylcumyl peroxide.

The hydroperoxides may include diisopropylbenzene hydroperoxide and cumene hydroperoxide.

The silyl peroxides may include t-butyltrimethylsilyl peroxide, bis(t-butyl)dimethylsilyl peroxide, t-butyltrivinylsilyl peroxide, bis(t-butyl)divinylsilyl peroxide, tris(t-butyl)vinylsilyl peroxide, t-butyltriallylsilyl peroxide, bis(t-butyl) diallylsilyl peroxide, and tris(t-butyl)allylsilyl peroxide.

In the present invention, as the curing agent, any one of these compounds may be used or any two or more compounds may be used in combination. Also, any of these curing agents (free-radical generators) may be used in combination with a decomposition accelerator, an inhibitor and so forth.

In order to keep the connecting terminals of wiring members from corroding, chloride ions and organic acids contained in the curing agent may preferably be in a content not more than 5,000 ppm. Those generating less organic acid after heat decomposition are more preferred. Also, on account of an improvement in the stability of wiring-connecting materials produced, the curing agent may preferably have a weight retention of not less than 20% by weight after open-leaving at room temperature (25° C.) and normal pressure for 24 hours.

Any of these curing agents may also-be coated with, e.g., a polymeric material of polyurethane type or polyester type so as to be made into microcapsules. Such a curing agent is preferred because of a prolonged pot life.

B. Polyurethane Resin

As the polyurethane resin, a resin obtained by the reaction of a diol, having two hydroxyl groups in the molecule, with a diisocyanate, having two isocyanate groups in the molecule, is preferred in the present invention because it has a good stress relaxation at the time of curing and has a polarity to bring about an improvement in adhesion.

As the diol, any of those which are linear compounds and having hydroxyl groups at the terminals maybe used. Stated specifically, it may include polyethylene adipate, polydiethylene adipate, polypropylene adipate, polybutylene adipate, polyhexamethylene adipate, polyneopentyl adipate, polycaprolactone polyol, poly(hexamethylene carbonate), silicone polyol, acrylic polyol, poly(ethylene glycol), poly(propylene glycol) and poly(tetramethylene glycol). Any of these compounds maybe used alone, or maybe used in combination of two or more types.

The diisocyanate may include isophorone diisocyanate, tolylene diisocyanate, 4,4'-diphenylmethane diisocyanate, naphthalene-1,5-diisocyanate, p-phenylene diisocyanate, 4,4'-methylenebiscyclohexyl diisocyanate, hexamethylene diisocyanate, and cyclohexane diisocyanate. Any of these compounds may be used alone, or may be used in combination of two or more types.

The polyurethane resin used in the present invention may preferably have a weight-average molecular weight of from 10,000 to 1,000,000. If it has a weight-average molecular weight less than 10,000, the wiring-connecting material tend to have a low cohesive force to make it difficult to attain a sufficient bond strength. If it has a weight-average molecular weight more than 1,000,000, the wiring-connecting material tend to have poor mixing properties and flow properties.

When the polyurethane resin is synthesized, in addition to these diol and diisocyanate, a polyhydric alcohol, an amine or an acid anhydride may further be mixed to allow them to react appropriately. For example, an imide-group-containing polyurethane obtained by reaction with an acid anhydride is preferred because it can be improved in adhesion and heat resistance.

The polyurethane resin used in the present invention may be a modified product. In particular, those modified with a radical-polymerizable functional group are preferred because it can be improved in heat resistance.

The polyurethane resin used in the present invention may preferably have a flow point of from 40° C. to 140° C., and more preferably from 50° C. to 100° C., as measured by the flow tester method. The flow point measured by the flow tester method is the temperature at which a cylinder begins to move when temperature is raised at a rate of temperature rise of 2° C./min under application of a pressure of 3 MPa to make a sample flow out of a die of 1 mm in diameter. The temperature is measured with a flow tester. If the polyurethane resin has a flow point lower than 40° C. as measured by the flow tester method, it may have inferior film-forming properties and adhesion. If it has a flow point higher than 140° C., it may have poor flow properties to affect electrical connection adversely.

C. Film-forming Material

The film-forming material used in the present invention may include polyimide resins, polyvinyl formal resins, polystyrene resins, polyvinyl butyral resins, polyester resins, acrylic resins, polyamide resins, xylene resins and phenoxy resins. Any of these may be used alone, or may be used in combination of two or more types.

The film-forming material is a material providing mechanical properties that enable films to be handled as films in an ordinary condition, such that, when a liquid material is made into a solid and its composition made up is formed into a self-supporting film, the resultant film can be handled with ease and not be readily broken or cracked or sticky.

As the film-forming material, polyimide resin is especially suited for the present invention in view of resistance to heat. Usable as the polyimide resin are, e.g., those obtained by subjecting a polyamic acid synthesized by addition reaction of a tetracarboxylic dianhydride with a diamine to heating and condensation to effect imidization. The polyimide resin may preferably have a weight-average molecular weight of from about 10,000 to about 150,000 in view of film-forming properties.

The acid dianhydride and diamine used when the polyamide resin is synthesized may appropriately be selected taking account of its solubility in solvents and compatibility with radical-polymerizable materials. Also, they may each be used alone as a single compound, or be used in combination of two or more compounds. Incidentally, on account of an improvement in adhesion and flexibility, at least one compound of the acid dianhydride and the diamine may preferably have a siloxane skeleton.

The film-forming material used in the present invention may be modified with a radical-polymerizable functional group.

D. Radical-polymerizable Substance

The radical-polymerizable substance used in the present invention is a substance having a functional group that polymerizes by virtue of radicals, and may include acrylates, methacrylates and maleimide compounds. Any of these may be used alone, or may be used in combination of two or more types.

The radical-polymerizable substance may be used in the state of either of a monomer and an oligomer, or may be used in combination of a monomer and an oligomer.

As examples of the acrylates preferable in the present invention, they may include methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylater 2-hydroxy-1,3-diacryloxypropane, 2,2-bis[4-(acryloxymethoxy)phenyl]propane, 2,2-bis[4-(acryloxypolyethoxy)phenyl]propane, dicyclopentenyl acrylate, tricyclodecanyl acrylate, tris(acryloyloxyethyl) isocyanurate, isocyanuric acid ethylene oxide modified diacrylate, and urethane acrylate. Methacrylates corresponding to these acrylates-may also be preferable in the present invention.

Radical-polymerizable substances having at least one of a dicyclopentanyl group, a tricyclodecanyl group and a triaz-ine ring are preferred because the wiring-connecting material obtained can be improved in resistance to heat.

As the radical-polymerizable substance used in the present invention, urethane acrylates are particularly preferred because of their superior adhesion. The urethane acrylates are those having at least one urethane group in the molecule, and may include, e.g., reaction products of polyols such as poly(tetramethylene glycol) with polyisocyanates and hydroxyl-group-containing acrylic compounds.

On account of an improvement in bond strength on the surfaces of inorganic matters such as metals, a radical-polymerizable substance further having a phosphate structure may also preferably be used in combination, in addition to the radical-polymerizable substance described above.

Such a radical-polymerizable substance having a phosphate structure, preferable in the present invention, may include reaction products of phosphoric anhydride with 2-hydroxyethyl acrylate or its corresponding methacrylate 2-hydroxyethyl methacrylate. Stated specifically, mono(2-methacryloyloxyethyl)acid phosphate and di(2-methacryloyloxyethyl)acid phosphate may be used. Any of these compounds may be used alone, or may be used in combination of two or more types.

As the maleimide compounds, those containing at least two maleimide groups in the molecule are suited for the present invention. Such maleimide compounds may include, e.g., 1-methyl-2,4-bismaleimidebenzene, N,N'-m-phenylenebismaleimide, N,N'-p-phenylenebismaleimide, N,N'-m-toluylenebismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenylsulfonebismaleimide, 2,2-bis[4-(4-maleimidophenoxy)phenyl]propane, 2,2-bis[3-s-butyl-3,4-(4-maleimidophenoxy)phenyl]propane, 1,1-bis[4-(4-maleimidophenoxy)phenyl]decane, 4,4'-cyclohexylidene-bis[1-(4-maleimidophenoxy)-2-cyclohexyl]benzene, and 2,2-bis[4-(4-maleimidophenoxy)phenyl)hexafluoropropane.

In the present invention, in addition to these radical-polymerizable substances, polymerization inhibitors such as hydroquinones and methyl ether hydroquinones may optionally appropriately be used.

E. Mixing Proportion

In the wiring-connecting material of the present invention, the above respective ingredients may be contained in an amount of from 2 to 75 parts by weight for the polyurethane resin, from 30 to 60 parts by weight for the radical-polymerizable substance, and from 0.1 to 30 parts by weight for the curing agent capable of generating a free radical upon heating. In the case when the film-forming material is contained, it may be contained in an amount of from 0 to 40 parts by weight. These ingredients may be mixed in the amounts appropriately determined within the above ranges.

If the polyurethane resin is in a content smaller than 2 parts by weight, the wiring-connecting material may have a poor effect of stress relaxation at the time of heat loading to lower bond strength. If it is in a content larger than 75 parts by weight, there is a possibility of a low connection reliability.

If the radical-polymerizable substance is in a content smaller than 30 parts by weight, the wiring-connecting material tends to have a low mechanical strength after its curing. If it is in a content larger than 60 parts by weight, the wiring-connecting material may have a high tackiness before its curing, resulting in poor handling properties.

If the curing agent capable of generating a free radical upon heating is in a content smaller than 0.1 part by weight, no sufficient rate of reaction can be attained as stated previously, to tend to make it difficult to attain a good bond strength and a small connection resistance. Also, if this curing agent is in a content larger than 30 parts by weight, the wiring-connecting material tends to have low flow properties, cause a high connection resistance and have a short pot life.

If the film-forming material is in a content more than 40 parts by weight, the wiring-connecting material tends to have low flow properties and cause a high connection resistance. Incidentally, the film-forming material need not be contained as long as other ingredients such as the polyurethane resin, the radical-polymerizable substance and the curing agent capable of generating a free radical upon heating enable sufficient film formation.

F. Conductive Particles

The wiring-connecting material of the present invention can interconnect the connecting terminals through their direct contact even when it does not contain any conductive particles. Hence, it need not particularly contain any conductive particles. However, on account of achievement of stabler connection, it may preferably contain conductive particles.

As the conductive particles, usable are particles of metals such as Au, Ag, Ni, Cu and solder, carbon particles or the like. In order to attain a sufficient pot life, the surface layers of particles may preferably be formed of not a transition metal such as Ni or Cu but a noble metal such as Au, Ag or a platinum group metal, and particularly preferably be formed of Au.

Composite particles comprised of a transition metal such as Ni the particle surfaces of which are covered with a noble metal such as Au; and particles having a conductivity partly such as composite particles comprised of a non-conductive, glass, ceramic, plastic or the like the particle surfaces of which are covered with conductive layers formed of the above metal and the surfaces thus covered are further covered with outermost layers formed of a noble metal may also be used in the present invention as the conductive particles.

Coat layers of a noble metal in such composite particles may be formed in a thickness of, but not particularly limited to, 100 Å or larger in order to achieve a good resistance. When, however, the layers of a noble metal are provided on the surfaces of a transition metal such as Ni, noble-metal layer defects caused when the conductive particles are mixed and dispersed, may cause the action of oxidation-reduction to generate free radicals to make the pot life short. Accordingly, the noble-metal layers may preferably be in a thickness 300 Å or larger. Also, if the noble-metal layers have a thickness larger than 1 μm, the effect may become saturated, and hence a layer thickness not larger than 1 μm is effective in view of cost and so forth.

Composite particles whose cores are formed of a plastic, or heat-fused metal particles are preferred because they are highly deformable upon application of heat and pressure, and deform with ease by the heat and pressure applied at the time of connection to enlarge the area of contact with connecting terminals, bringing about an improvement in reliability.

In the case when the conductive particles are mixed in the wiring-connecting material of the present invention, they may be mixed in an amount of from 0.1 to 30% by volume based on the adhesive component, which may appropriately be determined depending on purposes. In order to prevent adjoining circuits from short-circuiting due to any excess conductive particles, they may preferably be mixed in an amount of from 0.1 to 10% by volume.

G. Additives

In addition to the ingredients A to F described above, the wiring-connecting material of the present invention may further contain a filler, a softener, an accelerator, an anti-aging agent, a colorant, a flame retardant, a thixotropic agent, a coupling agent and so forth.

The compounding of a filler is preferred because the wiring-connecting material obtained can be improved in connection reliability and so forth. The filler may preferably have a maximum diameter that is smaller than the particle diameter of the conductive particles, and it may be compounded in an amount of from 5 to 60% by volume. If it is in an amount more than 60% by volume, the effect of improving reliability is saturated.

As the coupling agent, agents containing a vinyl group, an acrylic group, an amino group, an epoxy group or an isocyanate group are preferred in view of an improvement in adhesion.

H. Film Structure

The wiring-connecting material constituted as described herein need not be in the form of a single layer in which all the ingredients are present, and may be in the form of a stacked film having two or more layers. For example, it may have a double-layer structure consisting of a layer containing the curing agent capable of generating a free radical upon heating and a layer containing the conductive particles to separate these ingredients. This can bring about not only the effect of enabling achievement of high precision but also the effect of improving pot life.

I. Properties of Wiring-connecting Material

The wiring-connecting material of the present invention interconnects the connecting terminals facing to each other, by bringing them into contact with the adhesive which melt-flows at the time of connection, followed by curing to keep their connection, and thus the flow properties of the adhesive is an important factor. The wiring-connecting material of the present invention may preferably have a value of flow properties (B)/(A) of from 1.3 to 3.0, and more preferably from 1.5 to 2.5; the flow properties (B)/(A) being expressed using area (A) at the initial stage and area (B) after heating and pressing when, using glass sheets of 0.7 mm thick and 15 mm×15 mm, a wiring-connecting material of 35 μm thick and 5 mm×5 mm is held between the glass sheets and heated and pressured at 160° C. and 2 MPa for 10 seconds. As long as the value is 1.3 or more, the wiring-connecting material has sufficient flow properties and can achieve good connection. Also, as long as it is 3.0 or less, the wiring-connecting material is less likely to cause air bubbles to have a good reliability.

In addition, it is preferable for the wiring-connecting material of the present invention that its temperature at which exothermic reaction rises, Ta, is within the range of from 70° C. to 110° C., having a peak temperature (Tp) of Ta+5 to 30° C. and an end temperature (Te) of 160° C. or below, as measured with a differential scanning calorimeter (DSC) at a rate of temperature rise of 10° C./minute. Having such properties, the wiring-connecting material can achieve both low-temperature connecting performance and room-temperature storage stability.

The wiring-connecting material of the present invention is also advantageous for reducing internal stress of the resin after connection and improving adhesive force, and also can achieve good conduction characteristics. Accordingly, it may preferably have a storage elastic modulus at 25° C. after curing, of from 100 to 2,000 MPa, and more preferably from 300 to 1,500 MPa.

J. Production of Wiring-connected Board

The wiring-connecting material of the present invention is useful also as a filmlike adhesive for bonding IC chips to chip-mounting substrates and for bonding electric circuits to each other.

More specifically, the use of the wiring-connecting material of the present invention enables production of a wiring-connected board in the following way: A first wiring member having a first connecting terminal and a second wiring member having a second connecting terminal are heated and pressed while disposing face to face the first connecting terminal and the second connecting terminal and providing the wiring-connecting material (filmlike adhesive) of the present invention between the first wiring member and the second wiring member, resulting in an electrial connection therewith.

The wiring member may include;

chips component parts such as semiconductor chips, resistor chips and capacitor chips;

printed-wiring substrates on which chips have been mounted and/or which have been resist-processed;

TCPs (tape carrier packages) which comprise a TAB (tape-automated bonding) tape having chips mounted therewith and have been resist-processed; and liquid-crystal display panels.

It can be exemplified by;

an insulating substrate comprised of silicon, gallium arsenide, glass, ceramics, a glass/thermosetting resin composite material (such as a glass/epoxy composite material) or a plastic material (such as a plastic film or a plastic sheet) of polyimide or the like on which substrate a conductive metal foil is formed via an adhesive to form a wiring which involves connecting terminals;

an insulating substrate on which a conductive wiring has been formed by plating or vacuum deposition; and a substrate coated with a material such as a plating catalyst and on which a conductive wiring has been formed.

As wiring members preferable for the connection carried out by the production process of the present invention, they may typically include TAB tapes, FPCs (flexible printed-circuit boards), PWBs (printed-wiring boards), ITO (indium tin oxide), and semiconductor chips having connecting pads.

Materials for the wiring member may be any of silicon or gallium arsenide for semiconductor chips, glass, ceramics, polyimide, a glass/thermosetting resin composite material (such as a glass/epoxy composite material) and plastics, without any particular limitations.

Where the surfaces of conductive connecting terminals coming into contact with the wiring-connecting material are formed of a transition metal such as copper or nickel, free radicals are generated as a result of its action of oxidation-reduction. Hence, radical polymerization may proceed when the wiring-connecting material is applied to the first connecting terminal for provisional adhesion and is left for a certain time, so that it may become difficult for the connecting material to flow. This may cause insufficient electrical connection at the time of final connection to the second connecting terminal registered. Accordingly, the surface of at least one of the connecting terminals may preferably be constituted of at least one selected from gold, silver, a platinum group metal and tin. A plurality of metals may be used in combination, e.g., copper/nickel/gold, to make up a multi-layer configuration.

In the wiring-connected board production process of the present invention, it is also preferable for at least one of the connecting terminals to be directly disposed on the surface of a plastic substrate. Here, the plastic substrate may include films or sheets of polyethylene terephthalate resin, polyethylene naphthalate resin, polyether sulfone resin, polycarbonate resin or polyimide resin. It may preferably be comprised of polyimide resin.

Use of such a plastic substrate allows the wiring-connected board to be thinner and lighter. In the production process of the present invention, the use of the wiring-connecting material of the present invention enables connection at a low temperature, and hence a plastic having a relatively low glass transition temperature or melting point can be used, making it possible to obtain economically advantageous wiring-connected boards.

To make the wiring-connected board thin and lightweight, a wiring member so made up that connecting terminals making use of no adhesive are directly present on the plastic is preferred to those in which the plastic serving as a connecting member and connecting terminals formed of a conductive material are bonded with an adhesive. A polyimide resin with metal foil is commercially available which is obtained by a direct coating method where a resin solution is directly applied onto a metal foil such as copper foil in a uniform thickness without use of any adhesive. A wiring member formed by patterning this metal foil is preferred in the present invention. A member formed of a film extruded directly from an extruder in that form and a metal foil which have been thermocompression-bonded may also be used, and this metal foil may be patterned. Such a member may also be used in the present invention.

EXAMPLES

The present invention will be described below in greater detail by giving Examples.

Example 1

(1) Synthesis of Polyurethane Resin:

450 parts by weight of polybutylene adipate diol having an average molecular weight of 2,000, 450 parts by weight of polyoxytetramethylene glycol having an average molecular weight of 2,000 and 100 parts by weight of 1,4-butylene glycol were mixed, and then 4,000 parts by weight of methyl ethyl ketone was added. These were uniformly mixed and thereafter 390 parts by weight of diphenylmethane diisocyanate was added, where reaction was carried out at 70° C. to obtain a polyurethane resin A solution of 15 Pa·s (25° C.) in a solid content of 20% by weight.

This polyurethane resin had a weight-average molecular weight of 350,000 and had a flow point of 80° C. as measured by the flow tester method.

(2) Preparation of Wiring-Connecting Material:

In solid content weight ratio, 40 g of the polyurethane resin A (as solid content) synthesized as described above, 39 g of dimethyloltricyclodecane diacrylate, 1 g of phosphate type acrylate (available from KYOEISHA cHEMICAL Co., Ltd.; trade name: P2M), 20 g of phenoxy resin and 5 g of lauroyl peroxide (25 g as a methyl ethyl ketone solution) were mixed, and 3% by volume of conductive particles were further dispersed. The dispersion obtained was applied on a one-side surface-treated PET (polyethylene terephthalate) film of 80 μm thick by means of a coater, followed by hot-air drying at 70° C. for 10 minutes to obtain a wiring-connecting material having an adhesive layer of 35 μm thick.

Here, as the radical-polymerizable substance, dimethyloltricyclodecane diacrylate was used. As the film-forming material, phenoxy resin (available from Union Carbide; trade name: "PKHC"; weight-average molecular weight: 45,000) was used. As the curing agent capable of generating a free radical upon heating, a 20% by weight methylsethyl ketone solution of lauroyl peroxide [weight retention after open-leaving at room temperature (25° C.) and normal pressure for 24 hours: 97%) was used. As the conductive particles, conductive particles having an average particle diameter of 10 μm were used which were produced by providing nickel layers of 0.2 μm thick on the surfaces of particles whose cores were formed of polystyrene, and providing gold layers of 0.04 μm thick on the nickel layers.

(3) Connection of Wiring:

As shown in FIG. 1(c), using a polyimide film with copper foil prepared in a triple-layer configuration by bonding copper foil of 18 μm thick to polyimide film 18 via an adhesive 17, this copper foil was patterned in a line width of 100 μm and a pitch of 200 μm and subjected to resist processing, and thereafter Sn was plated onto the surface of a wiring and connecting terminal 16 formed of the copper foil, then a chip (not shown) was mounted, followed by encapsulation with a resin (not shown) at 200° C. to prepare a TCP (tape carrier package) 19.

As shown in FIG. 1(a), using a laminated substrate 11 provided with copper foil of 35 μm thick, the copper foil was also patterned in a line width of 100 μm and a pitch of 200 μm to form a circuit 12 and subjected to resist processing, and then gold was plated onto the copper foil surface to prepare a printed-wiring board (PWB) 10.

Next, to the surface of the PWB 10, the first wiring member, the bonding face of the wiring-connecting material 15, containing a resin composition 13 and conductive particles 14, was previously bonded, followed by heating and pressing at 70° C. and 0.5 MPa for 5 seconds to effect provisional connection. Thereafter, the PET film was peeled [FIG. 1(b)], and the TCP 19, the second wiring member, was placed thereon under registration [FIG. 1 (c)], where pressure 20 was applied with heating to effect interconnection to obtain a wiring-connected board 21 [FIG. 1(d)].

Example 2

(1) Synthesis of Urethane Acrylate:

400 parts by weight of polycaprolactone diol having an average molecular weight of 800, 131 parts by weight of 2-hydroxypropyl acrylate, 0.5 part by weight of dibutyltin dilaurate as a catalyst and 1.0 part by weight of hydroquinone monomethyl ether as a polymerization inhibitor were mixed while heating them to 50° C. with stirring. Then, 222 parts by weight of isophorone diisocyanate was dropwise added, and further the temperature was raised to 80° C. with stirring to carry out urethanation reaction. Making sure that the NCO conversion reached 99% or more, the reaction temperature was dropped to obtain urethane acrylate B.

(2) Synthesis of Polyimide Resin:

An acid anhydride 2,2-bis[4-(3,4-dicarboxyphenoxy)phenyl]propane dianhydride (26.1 g) was dissolved in 120 g of cyclohexanone to obtain an acid dianhydride solution.

Diamines 2,2-bis[4-(4-aminophenoxy)phenyl]propane (14.4 g) and 1,3-bis(3-aminopropyl)-1,1,3,3-tetramethyldisiloxane (3.8 g) were also dissolved in 120 g of cyclohexanone to obtain a diamine solution.

This diamine solution was dropwise added into a flask holding the acid dianhydride solution while controlling the temperature of the reaction system so as not to become higher than 50° C. After its addition was completed, the reaction mixture was further stirred for 10 hours. Next, a Dean-Stark trap was attached to the system, 50 g of toluene was added and the temperature was raised to 120° C. and kept it for 8 hours to effect imidization.

The solution obtained was cooled to room temperature, and thereafter reprecipitated in methanol. The precipitate obtained was dried to obtain a polyimide resin having a weight-average molecular weight of 32,000. This was dissolved in tetrahydrofuran to form a 20% by weight polyimide solution C.

(3) Preparation of Wiring-connecting Material and Production of Wiring-Connected Board:

A wiring-connecting material was prepared, and a wiring-connected board was produced, in the same manner as in Example 1 except that 40 g of the polyurethane resin (as solid content) synthesized in Example 1 was used as the polyurethane resin, 39 g of the urethane acrylate B synthesized in step (1) and 1 g of phosphate type acrylate were used in combination as the radical-polymerizable substance and 20 g of the polyimide resin C (as solid content) synthesized in step (2) was used as the film-forming material.

Example 3

Figure 2:
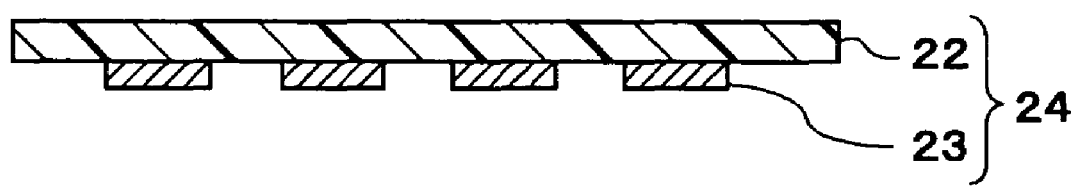
FIG. 2 is a cross-sectional view showing connecting portions of a flexible printed-circuit board used in Example 3.
Figure 3:
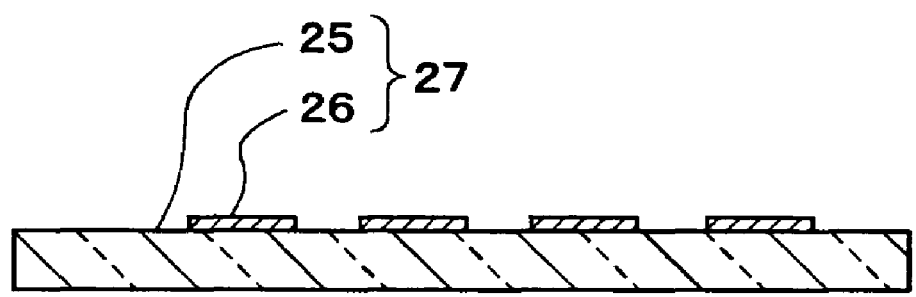
FIG. 3 is a cross-sectional view showing connecting portions on a wiring substrate of a liquid-crystal display panel, used in Example 4.

As shown in FIG. 2, using a polyimide film with copper foil prepared in a double-layer configuration consisting of a polyimide film 22 and copper foil of 18 μm thick, this copper foil was patterned in a line width of 100 μm and a pitch of 200 μm to form a circuit and a connecting terminal 23 and subjected to resist processing, and thereafter Au was plated onto the surface of the connecting terminal 23 to prepare a flexible printed-circuit board (FPC) 24. A wiring-connected board was obtained in the same manner as in Example 2 except that the TCP 19 was replaced with this FPC 24.

Example 4

Using a wiring-connecting material of 15 μm thick, a wiring-connected board was obtained in the same manner as in Example 3 except that the printed-wiring board (PWB) 10 was replaced with a liquid-crystal display panel 27 comprising a glass substrate 25 and a connecting terminal and wiring 26 provided on the surface thereof using ITO.

Comparative Example 1

A wiring-connected board was obtained in the same manner as in Example 1 except for using a wiring-connecting material prepared by using a phenoxy resin (available from PKHC Union Carbide Corporation; trade name: PKHC; weight-average molecular weight: 45,000), a bisphenol-A epoxy resin (available from Yuka Shell Epoxy Kabushiki Kaisha; trade name: YL980) and an imidazole type microcapsular curing agent (available from Asahi Chemical Industry Co., Ltd.; trade name: 3941HP), setting the solid-content weight ratio of phenoxy resin/bisphenol-A epoxy resin/imidazole type microcapsular curing agent=40/20/40, and mixing conductive particles therein in the same manner as in Example 1.

Comparative Example 2

A wiring-connecting material was prepared, and a wiring-connected board was produced, in the same manner as in Example 1 except that the polyurethane resin A was replaced with a phenoxy resin (PKHC).

Using the wiring-connecting materials and wiring-connected boards obtained in the foregoing Examples 1 to 4 and Comparative Examples 1 and 2, the adhesion, connection resistance, storage properties, insulating properties, polyurethane resin flow properties, wiring-connecting material flow properties, modulus of elasticity after curing, and DSC characteristics were measured or evaluated. Results obtained are shown in Table 1. Here, the measurement and evaluation were made in the following way.

(1) Measurement of Adhesive Force:

The wiring-member connected article (wiring-connected board) obtained was separated in the direction of 90 degrees at a peel rate of 50 mm/minute to measure adhesive force. The adhesive force was measured immediately after the wiring-connected board was produced (initial stage) and after it was kept in a high-temperature high-humidity chamber of 85° C. and 85% RH for 500 hours.

(2) Measurement of Connection Resistance:

Using the wiring-connecting material obtained, a flexible printed-circuit board (FPC) provided with 100 lines of copper circuit plated with Sn, having a line width of 100 μm, a pitch of 200 μm and a thickness of 18 μm and a glass sheet on the whole surface of which an ITO film was formed were connected over a width of 2 mm by heating and pressing at 160° C. and 3 MPa for 10 seconds.

The value of resistance between adjoining circuit lines was measured with a multi-meter at the initial stage and after keeping in a high-temperature high-humidity chamber of 85° C. and 85% RH for 500 hours. The resistance value was shown as an average at 50 spots of resistance between the adjoining circuit lines.

(3) Evaluation of Storage Properties:

The wiring-connecting material obtained was kept in a 30° C. thermostatic chamber for 30 days, and a circuit was connected in the same manner as in the above (2) to evaluate storage properties.

(4) Evaluation of Insulating Properties:

Using the wiring-connecting material obtained, a printed-circuit board having a comb-shaped circuit provided alternately with 250 lines of copper circuit wiring having a line width of 100 μm, a pitch of 200 μm and a thickness of 35 μm and a flexible printed-circuit board (FPC) provided with 500 lines of copper circuit wiring having a line width of 100 μm, a pitch of 200 μm and a thickness of 18 μm were connected over a width of 2 mm by heating and pressing at 160° C. and 3 MPa for 10 seconds. A voltage of 100 V was applied to the comb-shaped circuit of the resultant connected article, and the value of insulation resistance after 500 hours of a 85° C. and 85% RH high-temperature high-humidity test was measured.

(5) Measurement of Flow Point of Polyurethane Resin:

The temperature at which a cylinder begins to move when temperature is raised at a rate of 2° C./min under application of a pressure of 3 MPa to make a sample flow out of a die of 1 mm in diameter was measured with a flow tester (manufactured by Shimadzu Corporation; trade name: CFT-100 Model).

(6) Evaluation of Flow Properties of Wiring-connecting Material:

Using a wiring-connecting material of 35 μm thick and 5 mm×5 mm, this was held between glass sheets of 0.7 mm thick and 15 mm×15 mm, and heated and pressed at 160° C. and 2 MPa for 10 seconds. The value of flow properties (B)/(A) was determined using area (A) at the initial stage and area (B) after heating and pressing, and regarded as an index of flow properties.

(7) Modulus of Elasticity after Curing:

The wiring-connecting material was immersed in 160° C. oil for 1 minute to effect curing. Storage elastic modulus of the cured film was measured (rate of temperature rise: 5° C./minute; 10 Hz) with a dynamic viscoelastometer to measure modulus of elasticity at 25° C.

(8) Measurement of DSC Characteristics:

Using the wiring-connecting material obtained, the temperature at which exothermic reaction rises, Ta, the peak temperature (Tp) and the end temperature (Te) were determined when measured with a differential scanning calorimeter (DSC; manufactured by TA Instruments Japan Inc.; trade name: Model 910) at a rate of 10° C./minute.

TABLE 1

| Items | | Example 1 | Example 2 | Example 3 | Example 4 | Comparative Example 1 | Comparative Example 2 |
|---|---|---|---|---|---|---|---|
| Adhesive force (gf/cm) | Initial stage | 1000 | 1000 | 800 | 1000 | 100 | 200 |
| | 80° C., 85% RH, 500 h | 800 | 900 | 600 | 900 | peeled | peeled |
| Connection resistance (Ω) | Initial stage | 2.2 | 2.3 | 2.1 | 2.1 | 90.6 | 2.1 |
| | 85° C., 85% RH, 500 h | 2.6 | 2.6 | 2.5 | 2.5 | >500 | 2.6 |
| Storage properties [connection resistance (Ω)] | | 2.2 | 2.4 | 2.3 | 2.2 | 120 | 2.3 |
| Insulation resistance (Ω) | Initial stage | $1 \times 10^9<$ | $1 \times 10^9<$ | $1 \times 10^9<$ | $1 \times 10^9<$ | $1 \times 10^9<$ | $1 \times 10^9<$ |
| | 85° C., 85% RH, 500 h | $1 \times 10^9<$ | $1 \times 10^9<$ | $1 \times 10^9<$ | $1 \times 10^9<$ | $1 \times 10^6$ | $1 \times 10^9<$ |
| Flow properties | | 1.9 | 1.9 | 1.9 | 1.9 | 2.4 | 1.8 |
| Modulus of elasticity (25° C.)(MPa) | | 8001 | 600 | 600 | 600 | 1800 | 1400 |
| Exothermic reaction (DSC) (° C.) | Arising temperature (Ta) | 89 | 92 | 92 | 92 | 98 | 86 |
| | Peak temperature (Tp) | 107 | 106 | 106 | 106 | 125 | 101 |
| | End temperature (Te) | 148 | 150 | 150 | 150 | 160 | 142 |

In all Examples, the adhesive force was approximately from 7.85 to 9.81 N/cm (800 to 1,000 gf/cm) as initial values, and was approximately from 5.88 to 8.83 N/cm (600 to 900 gf/cm) even after the test for resistance to moisture, showing a good adhesive force without any great decrease in bond strength. Comparative Example 1 showed insufficient curing reaction, and Comparative Example 2 showed a bond strength of about 1.96 N/cm (200 gf/cm) because the polyurethane resin was not used, resulting in a low adhesive force.

The wiring-connecting material obtained in Example 1 had a low connection resistance at the initial stage and caused only a little increase in resistance after the high-temperature high-humidity test, showing a good connection reliability. The wiring-connecting materials of Examples 2, 3 and 4 and Comparative Example 2 also likewise achieved a good connection reliability. On the other hand, in Comparative Example 1, the curing reaction was so insufficient as to bring about a poor state of adhesion, resulting in a high connection resistance.

In Examples 1 to 4, results of connection were obtainable which were the same as those in a condition where the wiring-connecting materials were not treated in a 30° C. thermostatic chamber for 30 days (i.e., at the initial stage) In Examples 1 to 4, good insulating properties of $1.0 \times 10^9$ Ω was also obtainable, and any lowering of insulating properties was observable.

With regard to the flow properties, both Example 1 and Example 2 showed a value of 1.9. Also, the modulus of elasticity of the wiring-connecting material of Example 1 at 25° C. after curing was measured, and it was 800 MPa.

The wiring-connecting material of Example 1 also showed a curing reaction rise temperature of 89° C., a peak temperature of 107° C. and an end temperature of 148° C. That of Example 2 showed a curing reaction rise temperature of 92° C., a peak temperature of 106° C. and an end temperature of 150° C. This proves that they are curable at a lower temperature and, from the result of evaluation of storage properties, they have superior storage properties.

Further, in the measurement of connection resistance, wiring members were also prepared in one of which Sn was plated onto the copper circuit and in the other of which it was not done. Using the wiring-connecting material produced in Example 1, the wiring members were provisionally connected to FPCs under the same conditions as in Example 1 and were finally connected after they were left for 24 hours, and then the connection resistance was measured. As a result, it was 2.3 Ω in the case where Sn was plated, whereas it was 5 Ω in the case where Sn was not plated and the copper surface was uncovered.

INDUSTRIAL APPLICABILITY

As described above in detail, the present invention makes it possible to provide a wiring-connecting material for electric and electronic use, having better low-temperature fast-curing performance than any conventional epoxy resin type materials, also having a pot life, and less causative of circuit corrosion.

What is claimed is:

1. A wiring-connecting material adapted to be interposed between connecting terminals facing each other and with which the connecting terminals are electrically connected in the pressure direction while pressing said connecting terminals facing each other, comprising at least two different types of thermoplastic resins, said at least two different thermoplastic resins including a film-forming material which has a weight-average molecular weight of at least 10,000, and a thermoplastic resin which has a weight-average molecular weight of at least 350,000, a radical-polymerizable substance, a curing agent generating a free radical upon heating, conductive particles, and a phosphate, wherein said thermoplastic resin which has a weight-average molecular weight of at least 350,000 is a polyurethane resin having a weight-average molecular weight of at least 350,000.

2. The wiring-connecting material according to claim 1, wherein said phosphate is a radical-polymerizable substance having a phosphate structure.

3. The wiring-connecting material according to claim 2, wherein the material is in the form of a film.

4. The wiring-connecting material according to claim 3, wherein said film is a self-supporting film.

5. A wiring-connecting material adapted to be interposed between connecting terminals facing each other and with which the connecting terminals are electrically connected in the pressure direction while pressing said connecting terminals facing each other, comprising at least two different types of thermoplastic resin, said at least two different types of thermoplastic resin including a film-forming material which has a weight-average molecular weight of at least 10,000, and a thermoplastic resin which has a weight average molecular weight of at least 350,000, a radical-polymerizable substance, a curing agent generating a free radical upon heating, conductive particles, and a phosphate, said phosphate being a radical-polymerizable substance having a phosphate structure, and wherein the at least two different types of thermoplastic resin include a polyurethane resin.

6. A wiring-connecting material adapted to be interposed between connecting terminals facing each other and with which the connecting terminals are electrically connected in the pressure direction while pressing said connecting terminals facing each other, comprising at least two different thermoplastic resins, said at least two different types of thermoplastic resin including a film-forming material which has a weight-average molecular weight of at least 10,000, and a thermoplastic resin which has a weight average molecular weight of at least 350,000, a radical-polymerizable substance, a curing agent generating a free radical upon heating, conductive particles, and a phosphate, wherein the at least two different thermoplastic resin include a polyurethane resins.

* * * * *